US012588650B2

(12) United States Patent
Petersen et al.

(10) Patent No.: US 12,588,650 B2
(45) Date of Patent: Mar. 31, 2026

(54) FAILURE INDICATION SYSTEM

(71) Applicant: FarrPro, Inc., Iowa City, IA (US)

(72) Inventors: Amos Isaac Petersen, Iowa City, IA (US); Steven James Hoff, Iowa City, IA (US); James Donald Riley, Iowa City, IA (US); Christian Loza, Iowa City, IA (US)

(73) Assignee: FARRPRO, INC., Iowa City, IA (US)

( * ) Notice: Subject to any disclaimer, the term of this patent is extended or adjusted under 35 U.S.C. 154(b) by 234 days.

(21) Appl. No.: 18/440,627

(22) Filed: Feb. 13, 2024

(65) Prior Publication Data

US 2024/0268333 A1 Aug. 15, 2024

Related U.S. Application Data

(60) Provisional application No. 63/445,127, filed on Feb. 13, 2023.

(51) Int. Cl.
*A01K 1/015* (2006.01)
*G01R 31/56* (2020.01)

(52) U.S. Cl.
CPC ............ *A01K 1/0158* (2013.01); *G01R 31/56* (2020.01)

(58) Field of Classification Search
CPC .............................. A01K 1/0158; G01R 31/56
USPC ....................................................... 340/573.1
See application file for complete search history.

(56) References Cited

U.S. PATENT DOCUMENTS

| | | | |
|---|---|---|---|
| 1,197,343 A | 9/1916 | Charlesworth | |
| 1,205,332 A | 11/1916 | Damon | |
| 1,230,917 A | 6/1917 | Maurer | |
| 1,850,657 A | 3/1932 | Brower | |
| 1,900,342 A | 3/1933 | Hess | |
| 2,732,826 A | 1/1956 | Dawson | |
| 3,028,097 A | 4/1962 | Johnson | |
| 3,196,834 A | 7/1965 | Hall | |
| 5,092,271 A * | 3/1992 | Kleinsasser | F28F 21/062 |
| | | | 119/508 |
| 5,167,003 A | 11/1992 | Montanari | |
| 5,308,310 A | 5/1994 | Roff | |
| 6,116,190 A | 9/2000 | Kitt | |

(Continued)

FOREIGN PATENT DOCUMENTS

| | | | | |
|---|---|---|---|---|
| KR | 102097968 B1 * | 4/2020 | ............. | G06Q 50/10 |

OTHER PUBLICATIONS

Graphine Heat Film, Radiant Panel Technologies, https://radiantpaneltechnologies.com/products/graphene-heat-film/ (retrieved Jun. 10, 2024).

(Continued)

*Primary Examiner* — Eric Blount
(74) *Attorney, Agent, or Firm* — McKee, Voorhees & Sease, PLC

(57) ABSTRACT

In one or more arrangements, a failure indication system is provided having a light assembly, a heating mat assembly and a control circuit. The light assembly is configured to project a wavelength of light that is visible to animals and that illuminates the heating mat assembly to attract an animal to the heating mat. The control circuit is configured to detect when a fault has occurred with the heating mat assembly. When the control circuit detects that a fault has occurred with the heating mat assembly, the control circuit causes the light assembly to indicate the heating mat assembly is not functioning properly.

32 Claims, 17 Drawing Sheets

(56) References Cited

U.S. PATENT DOCUMENTS

| 6,500,111 | B1 | | 12/2002 | Salmon | |
|---|---|---|---|---|---|
| 6,506,147 | B2 | | 1/2003 | Eustace | |
| 6,880,188 | B1 | | 4/2005 | Schmidt | |
| 6,893,390 | B1 | | 5/2005 | Mackin | |
| 7,117,816 | B2 | * | 10/2006 | Behnke | A61F 7/034 |
| | | | | | 119/28.5 |
| 7,153,285 | B2 | | 12/2006 | Lauman | |
| 9,408,282 | B1 | | 8/2016 | Springer | |
| 9,778,605 | B2 | | 10/2017 | Kabata | |
| D873,692 | S | * | 1/2020 | Shen | D10/114.1 |
| 11,044,887 | B2 | * | 6/2021 | Bioret | A01K 1/0158 |
| 2002/0096984 | A1 | | 7/2002 | Konishi | |
| 2005/0235922 | A1 | | 10/2005 | Bryant | |
| 2006/0079730 | A1 | | 4/2006 | Getsla | |
| 2009/0159011 | A1 | | 6/2009 | Santo | |
| 2010/0222638 | A1 | | 9/2010 | Chilton | |
| 2015/0065787 | A1 | | 3/2015 | Bohnen | |
| 2016/0030616 | A1 | | 2/2016 | Nariyuki | |
| 2016/0309916 | A1 | | 10/2016 | Pothen | |
| 2017/0047887 | A1 | | 2/2017 | Hilliard | |
| 2017/0135888 | A1 | | 5/2017 | Wakabayashi | |
| 2023/0140301 | A1 | | 5/2023 | Petersen et al. | |
| 2023/0141546 | A1 | | 5/2023 | Petersen et al. | |
| 2023/0156869 | A1 | * | 5/2023 | Rurs | H05B 3/36 |
| | | | | | 219/112 |

OTHER PUBLICATIONS

Heat Mats & Pads [online]. QC Supply, [retrieved on Jan. 18, 2023]. Retrieved from the Internet: <URL: https://www.qcsupply.com/farm-livestock/mats-flooring/heat-mats.html>.

Heat Pads [online]. Barn World, [retrieved on Jan. 18, 2023]. Retrieved from the Internet: <URL: https://www.barnworld.com/livestock-supplies/Heating-Pads/>.

Heat Pads [online]. Hog Slat, [retrieved on Feb. 7, 2023]. Retrieved from the Internet: <URL: https://www.hogslat.com/heat-pad-farrowing-piglet-swine>.

Vittetoe heat lamps products page—retrieved Oct. 25, 2021 from https://vittetoe.com/heat-lamps.

* cited by examiner

FAILURE INDICATION SYSTEM

CROSS REFERENCE TO RELATED APPLICATIONS

This application claims priority to U.S. Provisional Patent Application 63/445,127 filed on Feb. 13, 2023 and titled FAILURE INDICATION SYSTEM, which is hereby incorporated by reference herein in its entirety, including any figures, tables, or drawings or other information.

FIELD OF THE DISCLOSURE

This disclosure relates generally to a failure indication system. More specifically, and without limitation, this disclosure relates generally to a failure indication system for use with heating mats.

OVERVIEW OF THE DISCLOSURE

Heating systems are used in modern agriculture to provide warmth for livestock in colder temperatures. For example, in farrowing of swine, it is frequently desirable to provide piglets with supplemental heat without overheating, and thereby stressing, the sow. However, due to their much higher surface area to volume ratios, more external heat needs to be applied to the piglets than to the sow to keep all of the animals at the optimum temperature. Failure to provide piglets with sufficient external heat may lead to the death of some piglets from chilling, starvation, and disease. While piglets may lie against the sow for warmth, this increases the chances of the sow rolling over and suffocating or crushing the piglets.

Some heating systems for farrowing provide a farrowing crate with separate sow and piglet areas separated by a fence. The piglet area is provided with a heat lamp and/or heat mat to draw the piglets away from the sow to avoid injury or death associated with crushing. Providing separate heating elements for the piglet area draws and warms the piglets without overheating the sow. The fence is provided with metal fingers or other barriers to allow the piglets to pass back and forth between the sow and piglet areas for feeding and heating, while preventing the sow from moving into the piglet area and crushing the piglets.

Some livestock heating systems utilize heating mats to generate heat. Heating mats are typically constructed of a plastic material with an embedded resistive element, such as a wire. While heating mats generate heat for piglets, the piglets may be unaware that the heating mat is warm. Typically, there is no visual indicator showing when a heating mat is warm since the heating mat does not change color when it is heated. As such, piglets do not know that the heating mat is warm unless they touch it. As such, a mechanism is needed to entice the piglets away from the heat of the sow and to the heating mat to receive warmth.

Additionally, heating mats are susceptible to catching fire if damaged. For example, when heating mats are used in livestock operations, livestock may apply very large amounts of downward pressure when standing and/or laying on such heating mats. In such applications, heating elements in conventional heating mats may become damaged when such weight is repeatedly applied to the heating mats. Damage to heating elements may cause shorts resulting in fires or hot spots that can harm livestock. As such, a mechanism to indicate to a barn worker when a heating mat is damaged is needed so that the damage can be repaired before a fire starts or livestock are harmed.

Therefore, for all the reasons stated above, and the reasons stated below, there is a need in the art for a failure indication system that improves upon the state of the art. Thus, it is a primary object of the disclosure to provide a failure indication system that improves upon the state of the art.

Another object of the disclosure is to provide a failure indication system that is safe to use.

Yet another object of the disclosure is to provide a failure indication system that is less susceptible to damage and that indicates to a barn worker when a heating mat is damaged.

Another object of the disclosure is to provide a failure indication system that indicates to livestock that a heating mat is warm.

Yet another object of the disclosure is to provide a failure indication system that is configured for use in livestock operations.

Another object of the disclosure is to provide a failure indication system that is easy to deploy.

Yet another object of the disclosure is to provide a failure indication system that is easy to install.

Another object of the disclosure is to provide a failure indication system that has a long useful life.

Yet another object of the disclosure is to provide a failure indication system that is durable.

Another object of the disclosure is to provide a failure indication system that has a robust design.

Yet another object of the disclosure is to provide a failure indication system that is easy to use.

Another object of the disclosure is to provide a failure indication system that is high quality.

These and other objects, features, or advantages of the disclosure will become apparent from the specification, figures and claims.

SUMMARY OF THE DISCLOSURE

In one or more arrangements, a failure indication system is provided having a light assembly. The light assembly having a housing, a bracket, and a lighting element. The failure indication system is further comprised of a heating mat assembly and a control circuit. The light assembly is configured to project a wavelength of light that is visible to animals and that illuminates the heating mat assembly. The control circuit is configured to detect when a fault has occurred with the heating mat assembly. When the control circuit detects that a fault has occurred with the heating mat assembly, the control circuit causes the light assembly to indicate the heating mat assembly is not functioning properly.

In one or more arrangements, a fault means that the heating mat assembly is drawing power outside of normal operating limits.

In one or more arrangements, a failure indication system is provided having a housing, a bracket, a light, and wherein the light is communicatively connected to a heating mat. The failure indication system is also comprised of a control system operably connected to the heating mat. The light is configured to attract an animal to the heating mat and produce a visual indicator. When the heating mat is damaged, the control system is configured to operate and the light is configured to produce the visual indicator.

DETAILED DESCRIPTION

Figure 1:
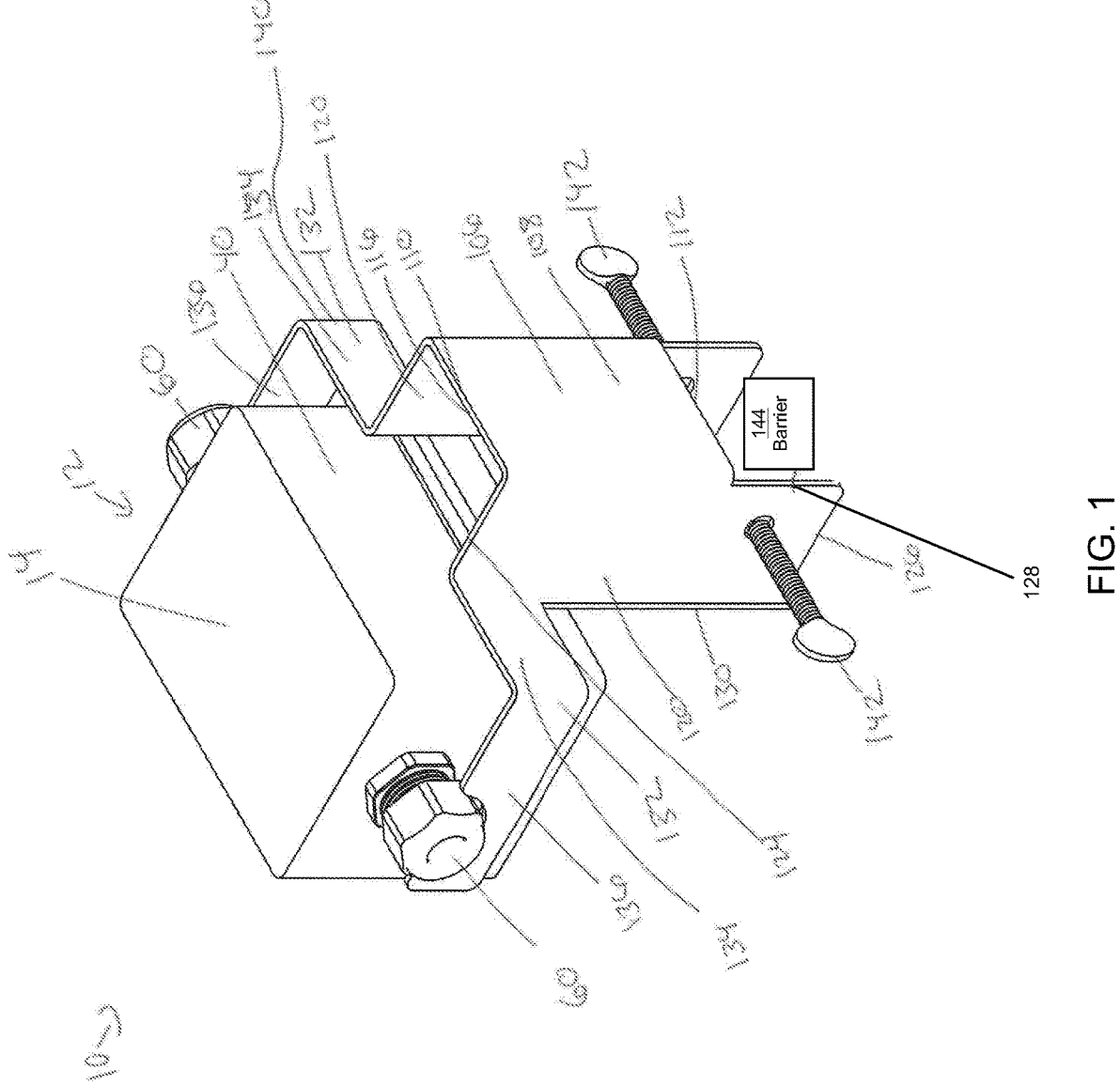
FIG. 1 shows an upper front right perspective view of a failure indication system, in accordance with one or more arrangements.

In the following detailed description of the embodiments, reference is made to the accompanying drawings which form a part hereof, and in which is shown by way of illustration specific embodiments in which the disclosure may be practiced. The embodiments of the present disclosure described below are not intended to be exhaustive or to limit the disclosure to the precise forms in the following detailed description. Rather, the embodiments are chosen and described so that others skilled in the art may appreciate and understand the principles and practices of the present disclosure. It will be understood by those skilled in the art that various changes in form and details may be made without departing from the principles and scope of the invention. It is intended to cover various modifications and similar arrangements and procedures, and the scope of the appended claims therefore should be accorded the broadest interpretation so as to encompass all such modifications and similar arrangements and procedures. For instance, although aspects and features may be illustrated in or described with reference to certain figures or embodiments, it will be appreciated that features from one figure or embodiment may be combined with features of another figure or embodiment even though the combination is not explicitly shown or explicitly described as a combination. In the depicted embodiments, like reference numbers refer to like elements throughout the various drawings.

It should be understood that any advantages and/or improvements discussed herein may not be provided by various disclosed embodiments, or implementations thereof. The contemplated embodiments are not so limited and should not be interpreted as being restricted to embodiments which provide such advantages or improvements. Similarly, it should be understood that various embodiments may not address all or any objects of the disclosure or objects of the invention that may be described herein. The contemplated embodiments are not so limited and should not be interpreted as being restricted to embodiments which address such objects of the disclosure or invention. Furthermore, although some disclosed embodiments may be described relative to specific materials, embodiments are not limited to the specific materials or apparatuses but only to their specific characteristics and capabilities and other materials and apparatuses can be substituted as is well understood by those skilled in the art in view of the present disclosure.

It is to be understood that the terms such as "left, right, top, bottom, front, side, height, length, width, upper, lower, interior, exterior, inner, outer, and the like as may be used herein, merely describe points of reference and do not limit the present invention to any particular orientation or configuration.

As used herein, "and/or" includes all combinations of one or more of the associated listed items, such that "A and/or B" includes "A but not B," "B but not A," and "A as well as B," unless it is clearly indicated that only a single item, subgroup of items, or all items are present. The use of "etc." is defined as "et cetera" and indicates the inclusion of all other elements belonging to the same group of the preceding items, in any "and/or" combination(s).

As used herein, the singular forms "a," "an," and "the" are intended to include both the singular and plural forms, unless the language explicitly indicates otherwise. Indefinite articles like "a" and "an" introduce or refer to any modified term, both previously-introduced and not, while definite articles like "the" refer to a same previously-introduced term; as such, it is understood that "a" or "an" modify items that are permitted to be previously-introduced or new, while definite articles modify an item that is the same as immediately previously presented. It will be further understood that the terms "comprises," "comprising," "includes," and/or "including," when used herein, specify the presence of stated features, characteristics, steps, operations, elements, and/or components, but do not themselves preclude the presence or addition of one or more other features, characteristics, steps, operations, elements, components, and/or groups thereof, unless expressly indicated otherwise. For example, if an embodiment of a system is described as comprising an article, it is understood the system is not limited to a single instance of the article unless expressly indicated otherwise, even if elsewhere another embodiment of the system is described as comprising a plurality of articles.

It will be understood that when an element is referred to as being "connected," "coupled," "mated," "attached," "fixed," etc. to another element, it can be directly connected to the other element, and/or intervening elements may be present. In contrast, when an element is referred to as being "directly connected," "directly coupled," "directly engaged" etc. to another element, there are no intervening elements present. Other words used to describe the relationship between elements should be interpreted in a like fashion (e.g., "between" versus "directly between," "adjacent" versus "directly adjacent," "engaged" versus "directly engaged," etc.). Similarly, a term such as "operatively", such as when used as "operatively connected" or "operatively engaged" is to be interpreted as connected or engaged, respectively, in any manner that facilitates operation, which may include being directly connected, indirectly connected, electronically connected, wirelessly connected, or connected by any other manner, method or means that facilitates desired operation. Similarly, a term such as "communicatively connected" includes all variations of information exchange and routing between two electronic devices, including intermediary devices, networks, etc., connected wirelessly or not. Similarly, "connected" or other similar language particularly for electronic components is intended to mean connected by any means, either directly or indirectly, wired and/or wirelessly, such that electricity and/or information may be transmitted between the components.

It will be understood that, although the ordinal terms "first," "second," etc. may be used herein to describe various elements, these elements should not be limited to any order by these terms unless specifically stated as such. These terms are used only to distinguish one element from another; where there are "second" or higher ordinals, there merely must be a number of elements, without necessarily any difference or other relationship. For example, a first element could be termed a second element, and, similarly, a second element could be termed a first element, without departing from the scope of example embodiments or methods.

Similarly, the structures and operations discussed herein may occur out of the order described and/or noted in the figures. For example, two operations and/or figures shown in succession may in fact be executed concurrently or may sometimes be executed in the reverse order, depending upon the functionality/acts involved. Similarly, individual operations within example methods described below may be executed repetitively, individually, or sequentially, to provide looping or other series of operations aside from single operations described below. It should be presumed that any embodiment or method having features and functionality described below, in any workable combination, falls within the scope of example embodiments.

As used herein, various disclosed embodiments may be primarily described in the context of heating systems. However, the embodiments are not so limited. It is appreciated that the embodiments may be adapted for use in other applications which may be improved by the disclosed structures, arrangements and/or methods. The system is merely shown and described as being used in in the context of heating systems for ease of description and as one of countless examples.

System 10:

In various embodiments, a failure indication system 10 (or simply system 10) may be formed of any suitable size, shape, and design and is configured to attract animals to a mat that is heated and to alert an operator when the mat has failed. In the arrangement shown, as one example, system 10 includes a light assembly 11 which includes a housing 12, a bracket 46, a gasket 74, a lens 90, a control system 200, and a heating mat assembly 145 among other components.

Housing 12:

Housing 12 is formed of any suitable size, shape, and design and is configured to hold various components of system 10. In the arrangement shown, as one example, housing 12 includes a top 14, a bottom 22, a front 32, a back 36, opposing sides 40, and a hollow interior 42. However, the embodiments are not so limited. In the arrangement shown, as one example, housing 12 extends between a top 14 and a bottom 22 and extends between opposing sides 40. However, any other suitable size, shape and design is hereby contemplated for use.

In this example arrangement, housing 12 includes a top 14 having a generally planar rectangular shape which extends from a front edge 16 to a back edge 18 and extends between opposing side edges 20. In this example arrangement, top 14 is configured to contain various components of system 10. However, any other suitable size, shape, and design is hereby contemplated for use.

In this example arrangement, housing 12 includes a front 32 having a generally planar rectangular shape which extends from a top 14 of housing 12 to a bottom 22 of housing 12 and extends between opposing sides 40 of housing 12. Front 32 includes an opening 34 having a generally circular shape configured to facilitate connection between a bracket 106 of system 10 and the housing 12. However, any other suitable size, shape, and design is hereby contemplated for use.

In this example arrangement, housing 12 includes a back 36 having a generally planar rectangular shape which extends from a top 14 of housing 12 to a bottom 22 of housing 12 and extends between opposing sides 40 of housing 12. Back 36 includes an opening 38 having a generally circular shape configured to facilitate connection between a bracket 106 of system 10 and the housing 12. However, any other suitable size, shape, and design is hereby contemplated for use.

In this example arrangement, housing 12 includes a bottom 22 configured to facilitate connection between housing 12 and a gasket 74. In this example arrangement, bottom 22 includes a front ridge 24, a back ridge 26, and opposing side ridges 28. Bottom 22 has a generally planar rectangular shape extending from a front ridge 24 to a back ridge 26 and extending between opposing side ridges 28. In this example arrangement, bottom 22 also includes one or more hollow cylinders 30 which facilitate connection between housing 12 and the other various components of system 10. However, any other size, shape, design or configuration is hereby contemplated for use.

In this example arrangement, housing 12 also includes a hollow interior 42. Hollow interior 42 is configured to contain various components of system 10 while housing 12 provides a barrier between the components of system 10 and any substances that may come into contact with system 10. In this example arrangement, hollow interior 42 includes an interior wall 44 extending throughout the hollow interior 42. However, any other size, shape, design or configuration is hereby contemplated for use.

In this example arrangement, the components of housing 12 are formed of any suitable size, shape, and design. In the arrangement shown, as one example, housing 12 is comprised of plastic materials. However, it is contemplated that the components of housing 12 may be constructed of any type of material including, but not limited to wood, plastic, metals, and/or composite materials.

Bracket 46:

Bracket 46 is formed of any suitable size, shape, and design and is configured to be positioned within housing 12 and hold various components of system 10. In the arrangement shown, as one example, bracket 46 includes a back wall 48 and one or more side walls 56. However, the embodiments are not so limited. However, any other suitable size, shape and design is hereby contemplated for use.

In this example arrangement, bracket 46 includes a back wall 48 configured to hold a light 66 of system 10. In this example arrangement, back wall 48 has a generally planar rectangular shape extending parallel to opposing sides 40 of housing 12 and extending between a front 32 of housing 12 and a back 36 of housing 12. In this example arrangement, back wall 48 of bracket 46 also includes one or more openings 50, one or more rectangular cut-outs 54, and one or more sockets 52. In this example arrangement, the one or more openings 50 and the one or more rectangular cut-outs 54 are configured to facilitate connection between bracket 46 and housing 12. In this example arrangement, the socket 52 of bracket 46 is configured to receive light 66. In this example arrangement, light 66 extends through socket 52 of bracket 46 and is held in place by switch 68. However, any other size, shape, design or configuration is hereby contemplated for use.

In this example arrangement, bracket 46 also includes one or more side walls 56 configured to hold bracket 46 in place inside of housing 12. In this example arrangement, the one or more side walls 56 have a generally planar rectangular shape extending perpendicular to opposing sides 40 of housing 12 and extending parallel to a front 32 of housing 12 and a back 36 of housing 12. In this example arrangement, the one or more side walls 56 of bracket 46 also include one or more openings 58. In this example arrangement, the one or more openings 58 have a generally circular shape of a similar size to opening 34 of front 32 of housing 12 and opening 38 of back 36 of housing 12. In this example arrangement, the one or more openings 58 of the one or more side walls 56 are configured to facilitate a connection between bracket 46 and housing 12. However, any other size, shape, design or configuration is hereby contemplated for use.

In this example arrangement, the components of bracket 46 are formed of any suitable size, shape, and design. In the arrangement shown, as one example, bracket 46 is comprised of metal materials. However, it is contemplated that the components of bracket 46 may be constructed of any type of material including, but not limited to, wood, plastic, metals, and/or composite materials.

Light 66:

Light 66 is formed of any suitable size, shape, and design and is configured to be positioned within housing 12, attract animals to a heating mat 146, and indicate when a heating mat 146 has failed. In the arrangement shown, as one example, light 66 is positioned to illuminate a heating mat 146 and produce a warm amber glow to attract animals to the heating mat 146. In this example arrangement, light 66 may be comprised of any type of light including, but not limited to, an incandescent bulb, a halogen bulb, a compact fluorescent lamp ("CFL"), or a light-emitting diode ("LED"). In this example arrangement, light 66 preferably illuminates a heating mat 146 with a light displaying a color temperature below 3500 Kelvin ("K") so that the light has red and orange wavelengths. In this example arrangement, light 66 illuminates a heating mat 146 with a red or orange wavelength to indicate warmth to an animal and to attract an animal to a heating mat 146 so that the animal can be warmed. However, the embodiments are not so limited. For example, any other suitable size, shape and design configured to attract an animal to a heating mat 146 is hereby contemplated for use.

In this example arrangement, light 66 is also configured to indicate to an operator when a heating mat 146 has failed. In this example arrangement, light 66 is configured to indicate when a fault has occurred in a heating mat 146. In this example arrangement, light 66 may indicate a heating mat 146 has failed visually by pulsing, flashing, turning off, rotating, changing colors, or using any other type of visual indication. However, any other size, shape, design or configuration is hereby contemplated for use.

In this example arrangement, light 66 is connected to a switch 68. Switch 68 includes a first end 70 and a second end 72 and is configured to position a light 66 within bracket 46 of system 10 and provide a mechanism for light 66 to turn on and off. In this example arrangement, first end 70 of switch 68 is configured to extend through socket 52 and into bracket 46. In this example arrangement, first end 70 of switch 68 is configured to connect to light 66. In this example arrangement, switch 68 includes a second end 72 configured to connect to housing 12. Further, in some various arrangements, switch 68 may be connected to housing 12 using various methods or means that provide a secure connection including, but not limited to, adhesive, glue, screws, bolts, clamps, pins, rivets, welding, snap connectors, friction fit connectors, chemical bonding, and/or any other process or means of secure connection. In this example arrangement, switch 68 may be operated autonomously or manually by an operator. However, any other size, shape, design or configuration is hereby contemplated for use.

Gasket 74:

Gasket 74 is formed of any suitable size, shape, and design and is configured to provide a seal between the hollow interior 42 of housing 12 and the outside of system 10 to protect the hollow interior 42 of housing 12 when system 10 is cleaned using power washing, disinfecting spray, or any other cleaning method. In the arrangement shown, as one example, gasket 74 includes a top 76, a bottom 80, a front ridge 84, a back ridge 86, and opposing side ridges 88. However, the embodiments are not so limited. In the arrangement shown, as one example, gasket 74 extends between a top 76 and a bottom 80 and extends between opposing side ridges 88. However, any other suitable size, shape and design is hereby contemplated for use.

In this example arrangement, gasket 74 includes a top 76 having a generally planar rectangular shape which extends from a front ridge 84 to a back ridge 86 and extends between opposing side ridges 88. In this example arrangement, top 76 also includes one or more hollow cylinders 78 which facilitate connection between housing 12, gasket 74, and the other various components of system 10. However, any other size, shape, design or configuration is hereby contemplated for use.

In this example arrangement, gasket 74 includes a bottom 80 having a generally planar rectangular shape which extends from a front ridge 84 to a back ridge 86 and extends between opposing side ridges 88. In this example arrangement, bottom 80 also includes one or more hollow cylinders 82 (not shown) which facilitate connection between housing 12, gasket 74, and the other various components of system 10. However, any other size, shape, design or configuration is hereby contemplated for use.

In this example arrangement, the components of gasket 74 are formed of any suitable size, shape, and design. In the arrangement shown, as one example, gasket 74 is comprised of plastic materials. However, it is contemplated that the components of gasket 74 may be constructed of any type of material that may be penetrated by light 66 including, but not limited to, wood, plastic, metals, and/or composite materials.

Lens 90:

Lens 90 is formed of any suitable size, shape, and design and is configured to allow the wavelengths of light 66 to penetrate lens 90 and illuminate a heating mat 146. In the arrangement shown, as one example, lens 90 includes a top 92 (not shown), a bottom 96, a front edge 100, a back edge 102, and opposing side edges 104. However, the embodiments are not so limited. In the arrangement shown, as one example, lens 90 extends between a top 92 and a bottom 96 and extends between opposing side edges 104. However, any other suitable size, shape and design is hereby contemplated for use.

In this example arrangement, lens 90 includes a top 92 having a generally planar rectangular shape which extends from a front edge 100 to a back edge 102 and extends between opposing side edges 104. In this example arrangement, top 92 also includes one or more hollow cylinders 94 (not shown) which facilitate connection between housing 12, gasket 74, lens 90, and the other various components of system 10. However, any other size, shape, design or configuration is hereby contemplated for use.

In this example arrangement, lens 90 includes a bottom 96 having a generally planar rectangular shape which extends from a front edge 100 to a back edge 102 and extends between opposing side edges 104. In this example arrangement, bottom 96 also includes one or more hollow cylinders 98 which facilitate connection between housing 12, gasket 74, lens 90, and the other various components of system 10. However, any other size, shape, design or configuration is hereby contemplated for use.

In this example arrangement, the components of lens 90 are formed of any suitable size, shape, and design. In the arrangement shown, as one example, lens 90 is comprised of transparent plastic materials. However, it is contemplated that the components of lens 90 may be constructed of any type of material that may be penetrated by light 66 including, but not limited to, wood, plastic, metals, and/or composite materials.

In this example arrangement, various components of system 10 including the housing 12, the gasket 74, and the lens 90 are connected. Fasteners 105 are formed of any suitable size, shape, and design and are configured to connect the various components of system 10. In this example arrangement, fasteners 105 are configured to extend through one or more hollow cylinders 98 of bottom 96 of lens 90, through one or more hollow cylinders 94 of top 92 of lens 90, through one or more hollow cylinders 82 of bottom 80 of gasket 74, through one or more hollow cylinders 78 of top 76 of gasket 74, and through one or more hollow cylinders 30 of bottom 22 of housing 12. In some various arrangements, fasteners 105 may utilize various methods or means to secure the connection between housing 12, gasket 74, and lens 90 including, but not limited to, adhesive, glue, screws, bolts, clamps, pins, rivets, welding, snap connectors, friction fit connectors, chemical bonding, and/or any other process or means of secure connection. However, any other size, shape, design or configuration is hereby contemplated for use.

Bracket 106:

Bracket 106 is formed of any suitable size, shape, and design and is configured to connect the various components of system 10 to a barrier 144 positioned in or around an area for animals. In the arrangement shown, as one example, bracket 106 includes a back wall 108, a front wall 114, one or more side walls 120, and one or more arms 132. However, any other suitable size, shape and design is hereby contemplated for use.

In this example arrangement, bracket 106 includes a back wall 108 having a generally planar rectangular shape which extends from a top edge 110 to a bottom edge 112 and extends between the one or more side walls 120. However, any other size, shape, design or configuration is hereby contemplated for use.

In this example arrangement, bracket 106 includes a front wall 114 having a generally planar rectangular shape which extends from a top edge 116 to a bottom edge 118 (not shown) and extends between the one or more side walls 120. However, any other size, shape, design or configuration is hereby contemplated for use.

In this example arrangement, bracket 106 includes one or more side walls 120 having a generally planar rectangular shape which extends from a top edge 124 to a bottom edge 126 and extends between a first side edge 128 of side wall 120 and a second side edge 130 of side wall 120. In this example arrangement, the one or more side walls 120 extend farther than the front wall 114 of bracket 106 or the back wall 108 of bracket 106 so that the bottom edge 126 of the one or more side walls 120 is located below the bottom edge 112 of back wall 108 and the bottom edge 118 of front wall 114.

In this example arrangement, the one or more side walls 120 also include one or more openings 122. In this example arrangement, openings 122 are configured to allow one or more fasteners 142 to connect bracket 106 to barrier 144. In this example arrangement, fasteners 142 connect bracket 106 to barrier 144 using various methods or means including, but not limited to, for example, screws, bolts, clamps, pins, rivets, welding, snap connectors, friction fit connectors, stitching, hook and loop connectors, adhesives, chemical bonding, and/or any other process or means that results in a permanent of semi-permanent connection. However, any other size, shape, design or configuration is hereby contemplated for use.

In this example arrangement, bracket 106 includes one or more arms 132 having a generally planar rectangular shape. In this example arrangement, the one or more arms 132 also include a first end 134 and a second end 136. In this example arrangement the first end 134 of the one or more arms 132 extends away from the bracket 106 and parallel to the back wall 108 of bracket 106. In this example arrangement, the second end 136 of the one or more arms 132 is connected to the first end 134 of the one or more arms 132 at a corner 140. In this example arrangement, the second end 136 extends away from bracket 106 and perpendicular to back wall 108 of bracket 106. In this example arrangement, second end 136 of the one or more arms 132 also include a notch 138. However, any other size, shape, design or configuration is hereby contemplated for use.

In this example arrangement, the components of bracket 106 are formed of any suitable size, shape, and design. In the arrangement shown, as one example, bracket 106 is comprised of metal materials. However, it is contemplated that the components of bracket 106 may be constructed of any type of material that configured to hold bracket 106 to a barrier 14 including, but not limited, to wood, plastic, metals, and/or composite materials.

Connection Members 60:

Connection members 60 are formed of any suitable size, shape, and design and are configured to connect the various components of system 10. In the arrangement shown, as one example, connection members 60 include a first end 62, a second end 64, and a washer 65. However, any other suitable size, shape and design is hereby contemplated for use.

In this example arrangement, the first end 62 of connection members 60 is configured to extend through opening 34 of front 32 of housing 12 and through opening 58 of side wall 56 of bracket 46. In this example arrangement, a second connection member having a first end 62 may extend through opening 38 of back 36 of housing 12 and through opening 58 of side wall 56 of bracket 46. In this example arrangement, the second end 64 of the one or more connection members 60 is positioned outside of housing 12. In some various arrangements, connection members 60 may utilize a washer 65 and various methods or means to secure the connection between housing 12 and bracket 46 including, but not limited to, adhesive, glue, screws, bolts, clamps, pins, rivets, welding, snap connectors, friction fit connectors, chemical bonding, and/or any other process or means of secure connection. However, any other size, shape, design or configuration is hereby contemplated for use.

In this example arrangement, the second end 64 of connection members 60 is positioned within notch 138 of the one or more arms 132 of bracket 106. In this example arrangement, the second end 64 of connection members 60 is configured to rotate within notch 138 so that the positioning of light 66 can be adjusted by an operator. However, any other size, shape, design or configuration is hereby contemplated for use.

Heating Mat Assembly 145:

Heating mat assembly 145 is formed of any suitable size, shape, and design and is configured to function as a heating mat 146 that is heated when operated to facilitate, for example, care of livestock. In the arrangement shown, as one example, system 10 includes a heating mat 146 positioned below system 10 so that light 66 may illuminate the heating mat 146 and attract livestock to the heating mat 146. In this example arrangement, heating mat 146 may be formed of various materials including, but not limited to, for example, polymers, resins, textiles, composites, and/or any other natural or synthetic materials. However, any other size, shape, design or configuration is hereby contemplated for use.

Control System 200:

In one or more arrangements, system 10 may be controlled using various means and/or methods to provide a desired light output. In one or more arrangements, system 10 includes a control system 200 configured to adjust light 66 by adjusting voltage and/or current that is applied to system 10. Additionally or alternatively, on one or more arrangements, control system 200 may be configured to connect and disconnect a power source to/from light 66. For example, in one or more arrangements, system 10 may include a relay switch 198 (not shown) configured to connect and disconnect a power source to/from light 66 in response to a control signal from control system 200. As an illustrative example, control system 200 may be configured to adjust light output by system 10 by adjusting the amount of time that the power source is connected to light 66. For example, control system 200 may connect the power source to light 66 for 1 second every 10 seconds when operated at a lower light output setting and connect the power source to light 66 for 1 second every 5 seconds at a higher light output setting. Additionally or alternatively, on one or more arrangements, control system 200 may be configured to connect and disconnect a power source to/from light 66 in response to readings of a heating mat 146 failure sensor 206 to indicate to an operator that the heating mat 146 has failed.

Control system 200 is formed of any suitable any suitable size, shape, and design and is configured to control operation of system 10. In the arrangement shown, as one example, control system 200 includes a control circuit 202, user interface 204, and/or sensors 206, among other components. Control Circuit 202:

Control circuit 202 is formed of any suitable size, shape, design and is configured to control operation of various components of system 10 in response to signals of sensors 206 and/or input from user interface 204. In the arrangement shown, as one example, control circuit 202 includes a communication circuit 210, a processing circuit 212, and a memory 214 having software code 216 or instructions that facilitates the operation of system 10.

Processing circuit 212 may be any computing device that receives and processes information and outputs commands according to software code 216 stored in memory 214. For example, in some various arrangements, processing circuit 212 may be discreet logic circuits or programmable logic circuits configured for implementing these operations/activities, as shown in the figures and/or described in the specification. In certain arrangements, such a programmable circuit may include one or more programmable integrated circuits (e.g., field programmable gate arrays and/or programmable ICs). Additionally or alternatively, such a programmable circuit may include one or more processing circuits (e.g., a computer, microcontroller, system-on-chip, smart phone, server, and/or cloud computing resources). For instance, computer processing circuits may be programmed to execute a set (or sets) of software code stored in and accessible from memory 214. Memory 214 may be any form of information storage such as flash memory, ram memory, dram memory, a hard drive, or any other form of memory.

Processing circuit 212 and memory 214 may be formed of a single combined unit. Alternatively, processing circuit 212 and memory 214 may be formed of separate but electrically connected components. Alternatively, processing circuit 212 and memory 214 may each be formed of multiple separate but communicatively connected components.

Software code 216 is any form of instructions or rules that direct how processing circuit 212 is to receive, interpret and respond to information to operate as described herein. Software code 216 or instructions are stored in memory 214 and accessible to processing circuit 212. As an illustrative example, in one or more arrangements, software code 216 or instructions may configure processing circuit 212 of control circuit 202 to monitor sensors 206 and perform various preprogramed actions in response to signals from sensors 206 satisfying one or more trigger conditions.

As some illustrative examples, some actions that may be initiated by control circuit 202 in response to signals from sensors 206 and/or user input from user interface 204 include but are not limited to, for example, connecting and disconnecting light 66 to/from a power source, controlling voltage and/or current provided by the power source to light 66, otherwise controlling output light provided by system 10, and/or sending notifications to users (e.g., emails, SMS, push notifications, automated phone call, social media messaging, and/or any other type of messaging) regarding operation of system 10 and/or management of livestock.

Communication circuit 210 is formed of any suitable size, shape, design, technology, and in any arrangement and is configured to facilitate communication with devices to be controlled, monitored, and/or alerted by control system 200. In one or more arrangements, as one example, communication circuit 210 includes a transmitter (for one-way communication), transceiver (for two-way communication), or microprocessor 218. In various arrangements, communication circuit 210 may be configured to communicate with various components of system 10 using various wired and/or wireless communication technologies and protocols over various networks and/or mediums, but not limited to, for example, IsoBUS, Serial Data Interface 12 (SDI-12), UART, Serial Peripheral Interface, PCI/PCIe, Serial ATA, ARM Advanced Microcontroller Bus Architecture (AMBA), USB, Firewire, RFID, Near Field Communication (NFC), infrared and optical communication, 802.3/Ethernet, 802.11/WIFI, Wi-Max, Bluetooth, Bluetooth low energy, UltraWideband (UWB), 802.15.4/ZigBee, ZWave, GSM/EDGE, UMTS/HSPA+/HSDPA, CDMA, LTE, FM/VHF/UHF networks, and/or any other communication protocol, technology or network.

Sensors 206:

Sensors 206 are formed of any suitable size, shape, design, technology, and in any arrangement configured to measure factors pertaining to operation of system 10 and/or monitoring and/or management of livestock. In some various arrangements, sensors 206 may include but are not limited to, for example, temperature sensors, voltage sensors, current sensors, location sensors (e.g., GPS sensors), position sensors, switches, motion sensors, proximity sensors, light sensors, cameras, microphones, LIDAR, humidity sensors, moisture sensors, and/or any other type of sensor, and/or various combinations thereof.

In some arrangements, sensors 206 may be formed along with control circuit 202 as a single combined unit. Alternatively, in some arrangements sensors 206 and control circuit 202 may be communicatively connected by communication circuit 210.

User Interface 204:

User interface 204 is formed of any suitable size, shape, design, technology, and in any arrangement and is configured to facilitate user control and/or adjustment of various components of system 10. In one or more arrangements, as one example, user interface 204 includes a set of inputs (not shown). Inputs are formed of any suitable size, shape, and design and are configured to facilitate user input of data and/or control commands. In various different arrangements, inputs may include various types of controls including, but not limited to, for example, buttons, switches, dials, knobs, a keyboard, a mouse, a touch pad, a touchscreen, a joystick, a roller ball, or any other form of user input. Optionally, in one or more arrangements, user interface 204 includes a display (not shown). Display is formed of any suitable size, shape, design, technology, and in any arrangement and is configured to display information of settings, sensor readings, time elapsed, and/or other information pertaining to operation or system 10 and/or management of livestock. In one or more arrangements, display may include, for example, LED lights, meters, gauges, screen or monitor of a computing device, tablet, and/or smartphone.

Additionally, or alternatively, in one or more arrangements, the inputs and/or display may be implemented on a separate device that is communicatively connected to control circuit 202. For example, in one or more arrangements, operation of control circuit 202 may be customized or controlled using a smartphone or other computing device that is communicatively connected to the control circuit 202 (e.g., via Bluetooth, WIFI, and/or the internet).

In Operation:

In operation, system 10 is configured to illuminate a heating mat 146 with light 66 to attract an animal to the heating mat. By illuminating the heating mat 146, the light 66 indicates to an animal that the heating mat 146 is warm.

Additionally, or alternatively, in one or more arrangements the light 66 of system 10 is positioned within housing 12 and is configured to indicate when heating mat 146 is in operation. Such visual indication of when heating mat 146 is in operation may be useful to assist an operator in monitoring and/or reviewing the status of system 10 as heat generated by heating mat 146 may not be easily visible. Such visual indicator may help avoid unintended operation of heating mat 146 (e.g., accidentally leaving heating mat 146 on when operation is not intended). Further, such visual indication of heating mat 146 may help an operator to identify when the heating mat 146 has suffered a failure. A failure of heating mat 146 includes but is not limited to, the heating mat 146; receiving too much power, receiving too little power, not drawing power, becoming partially or wholly damaged, or operating outside of normal operating predetermined limits. If the heating mat 146 has suffered a failure, light 66 may produce a visual indication including, but not limited to, pulsing, flashing, turning off, rotating, or changing colors. When an operator sees this visual indication, the operator becomes aware that the heating mat 146 has failed and will work to remedy the failure.

Figure 2:
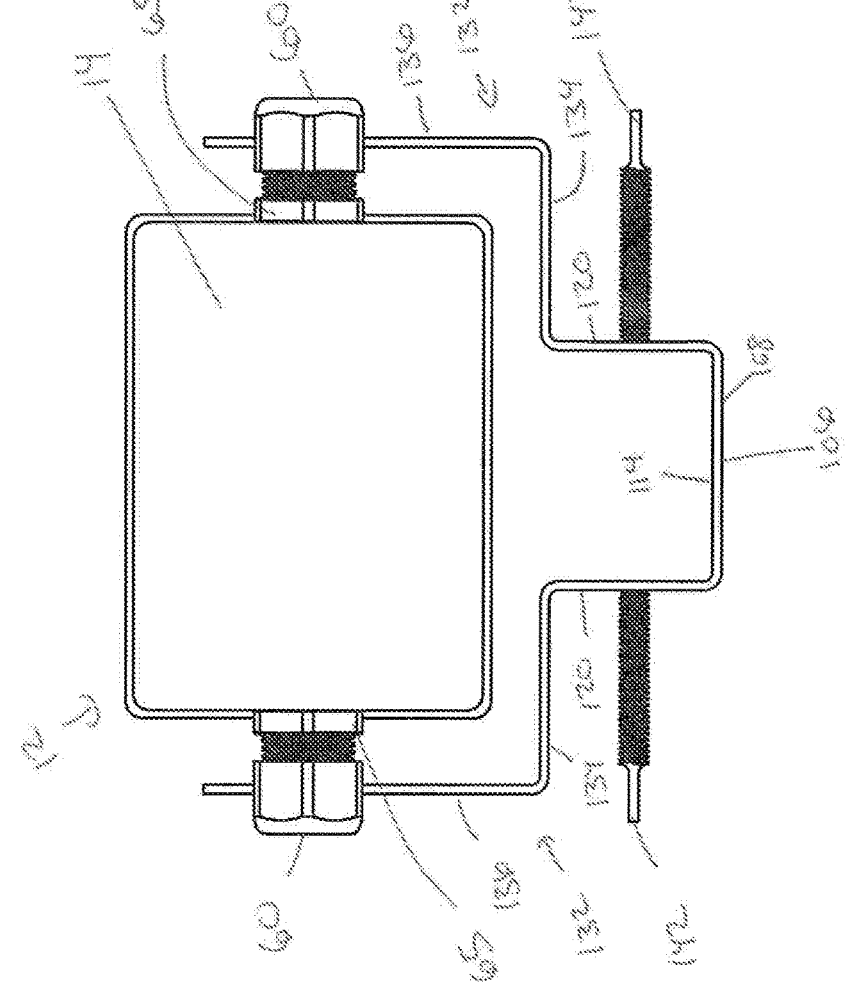
FIG. 2 shows a top view of a failure indication system, in accordance with one or more arrangements.
Figure 3:
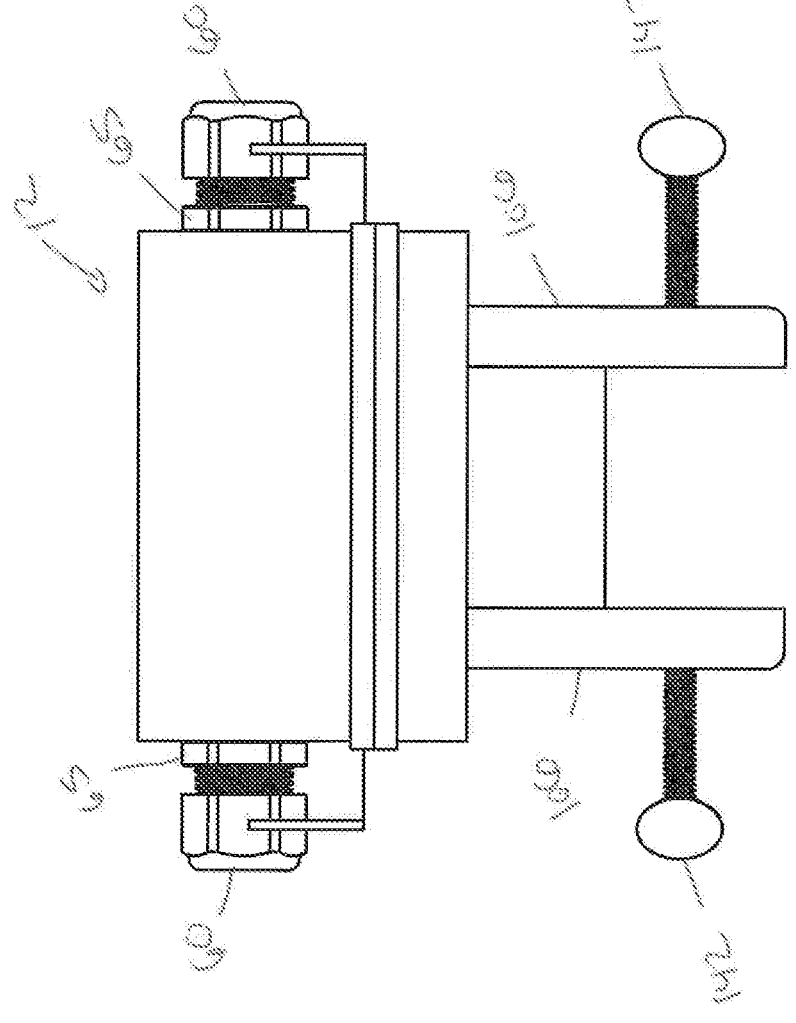
FIG. 3 shows a left side view of a failure indication system, in accordance with one or more arrangements.
Figure 4:
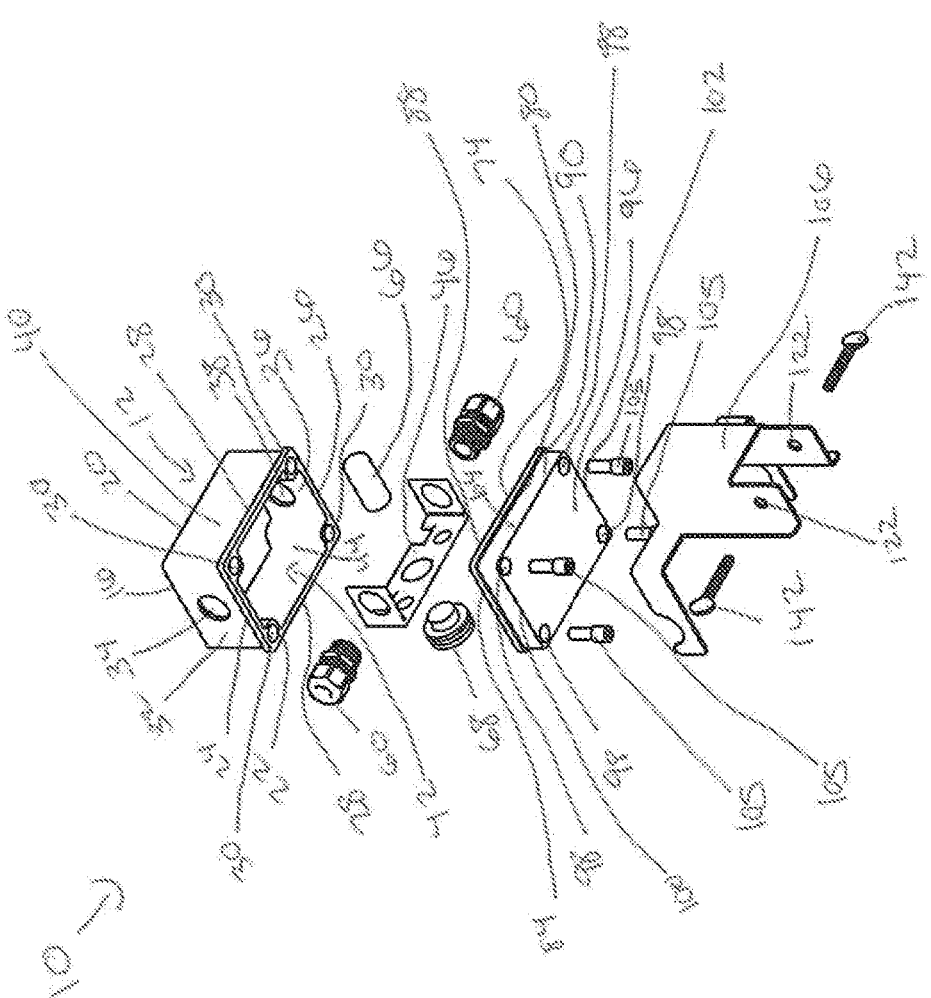
FIG. 4 shows an exploded lower front right perspective view of a failure indication system, in accordance with one or more arrangements.
Figure 5:
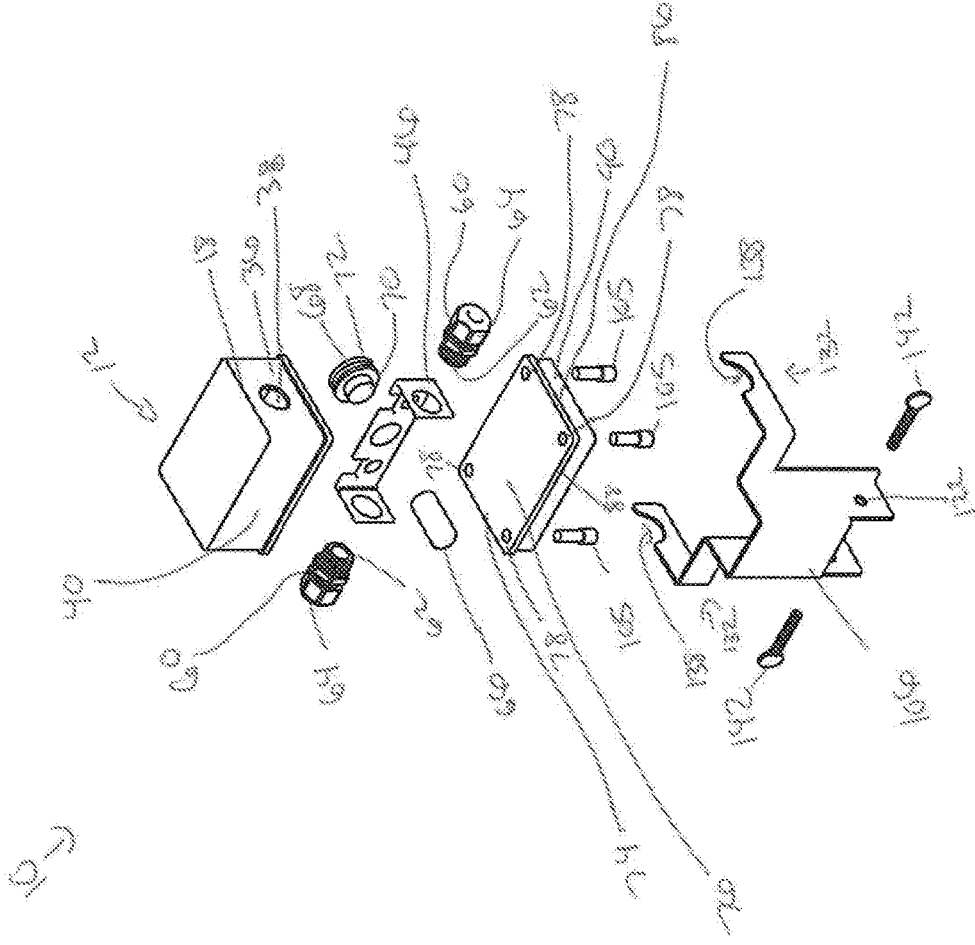
FIG. 5 shows an exploded upper rear right perspective view of a failure indication system, in accordance with one or more arrangements.
Figure 6:
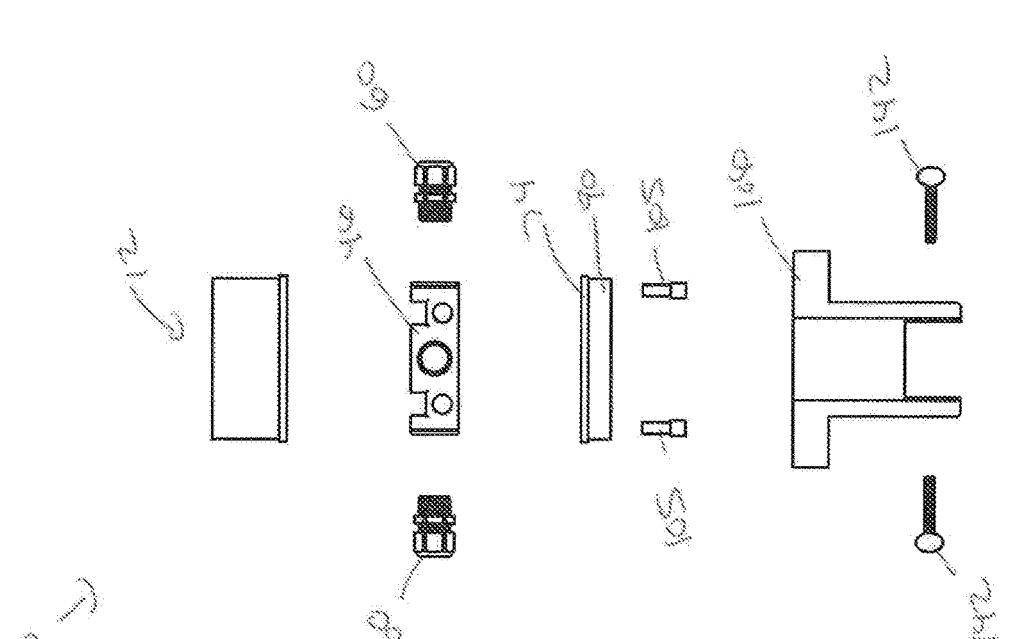
FIG. 6 shows an exploded right side view of a failure indication system, in accordance with one or more arrangements.
Figure 7:
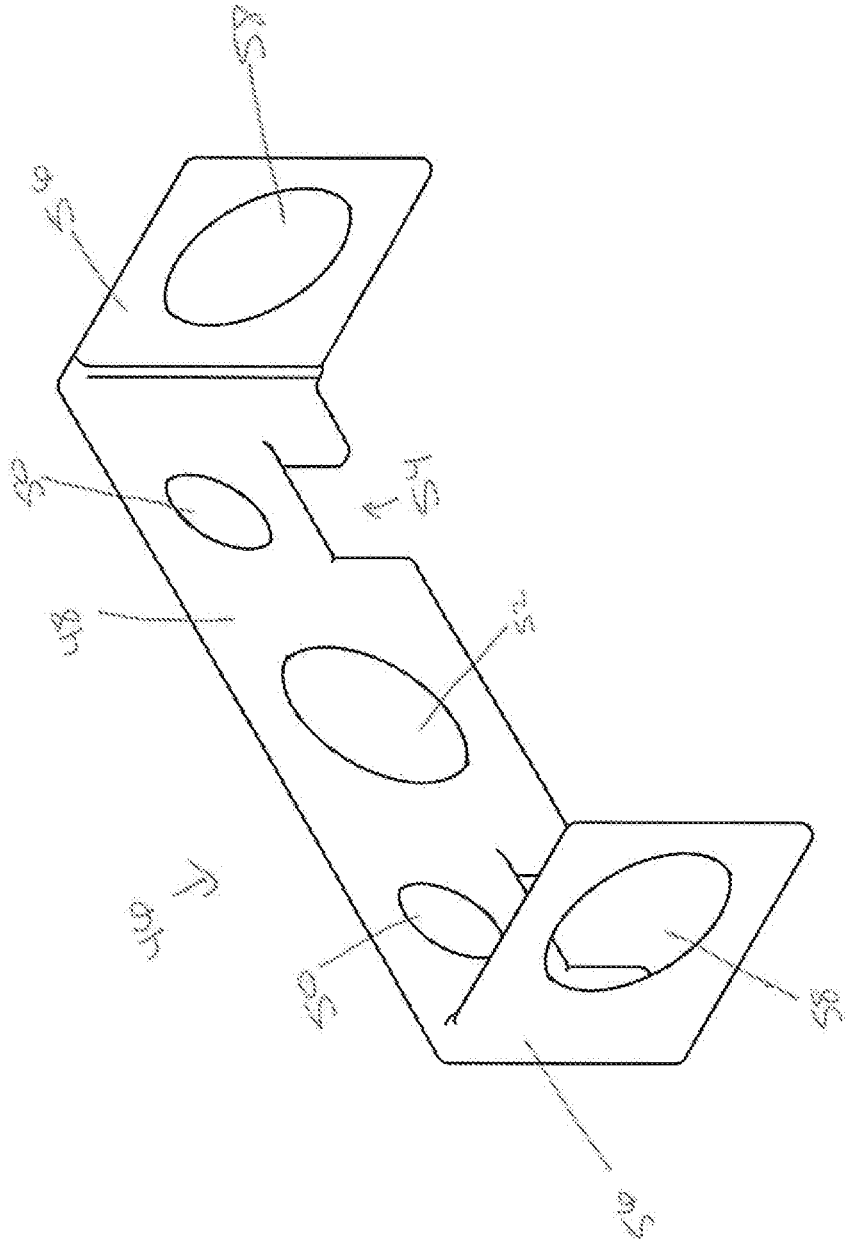
FIG. 7 shows an upper front right perspective view of a bracket for a failure indication system, in accordance with one or more arrangements.
Figure 8:
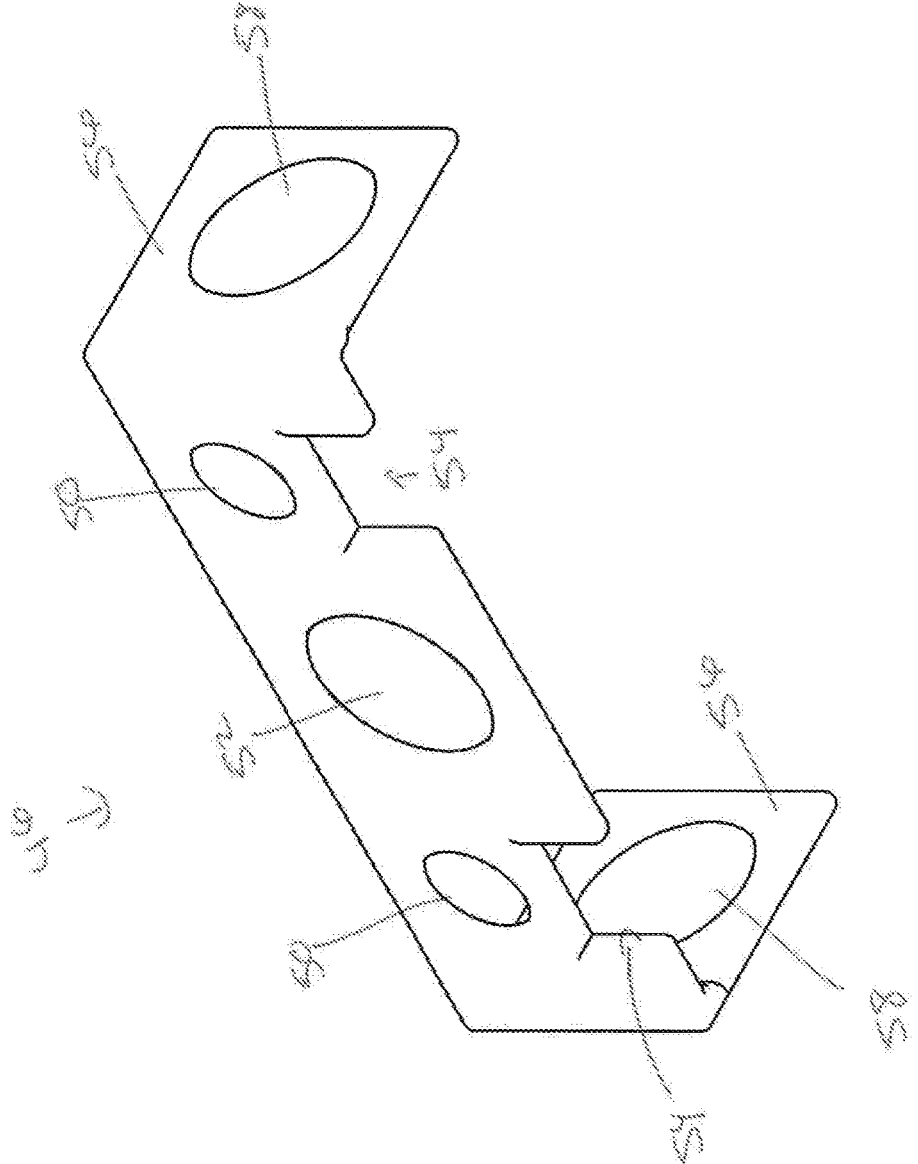
FIG. 8 shows a lower front left perspective view of a bracket for a failure indication system, in accordance with one or more arrangements.
Figure 9:
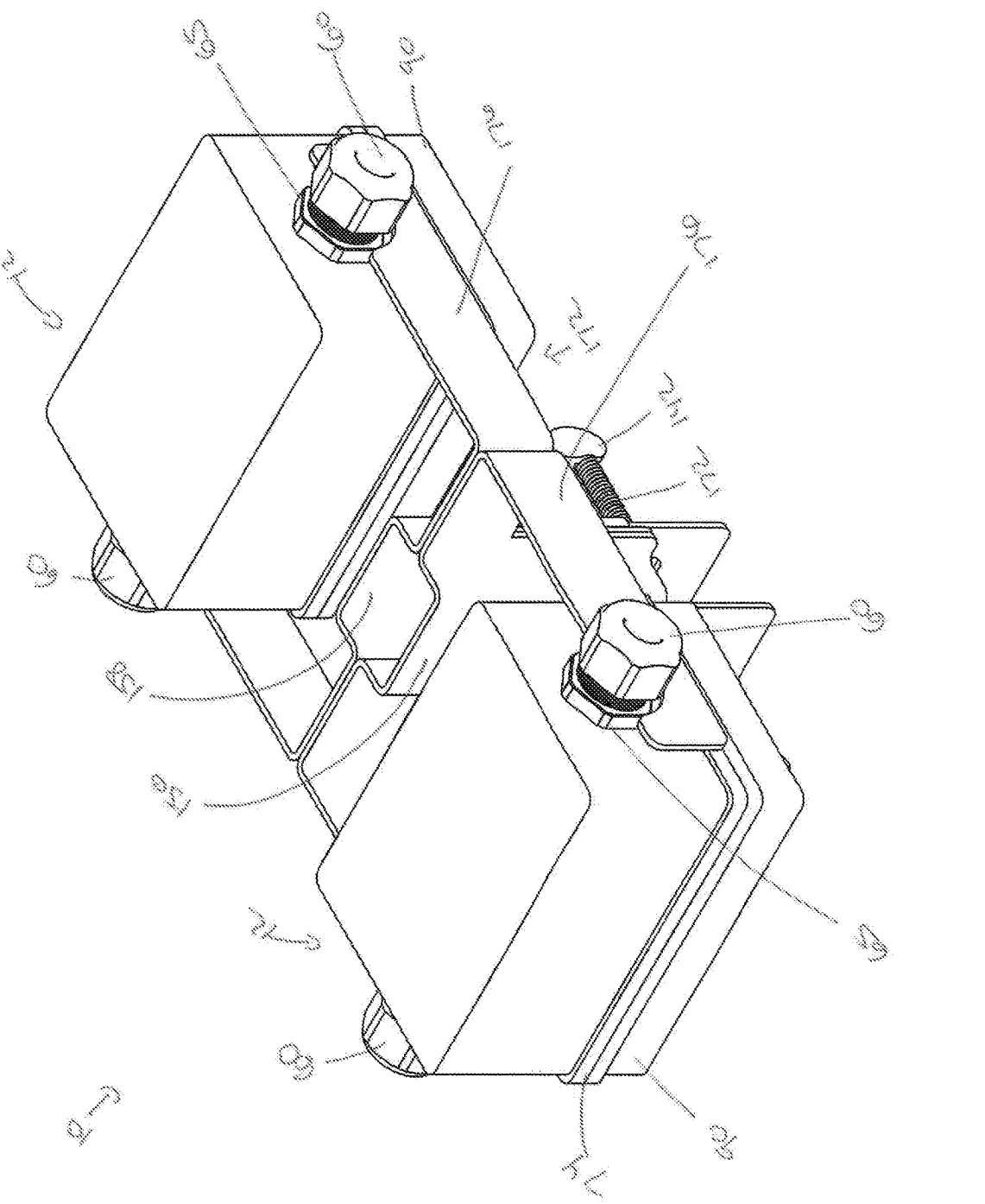
FIG. 9 shows an upper front right perspective view of a failure indication system, in accordance with one or more arrangements.
Figure 10:
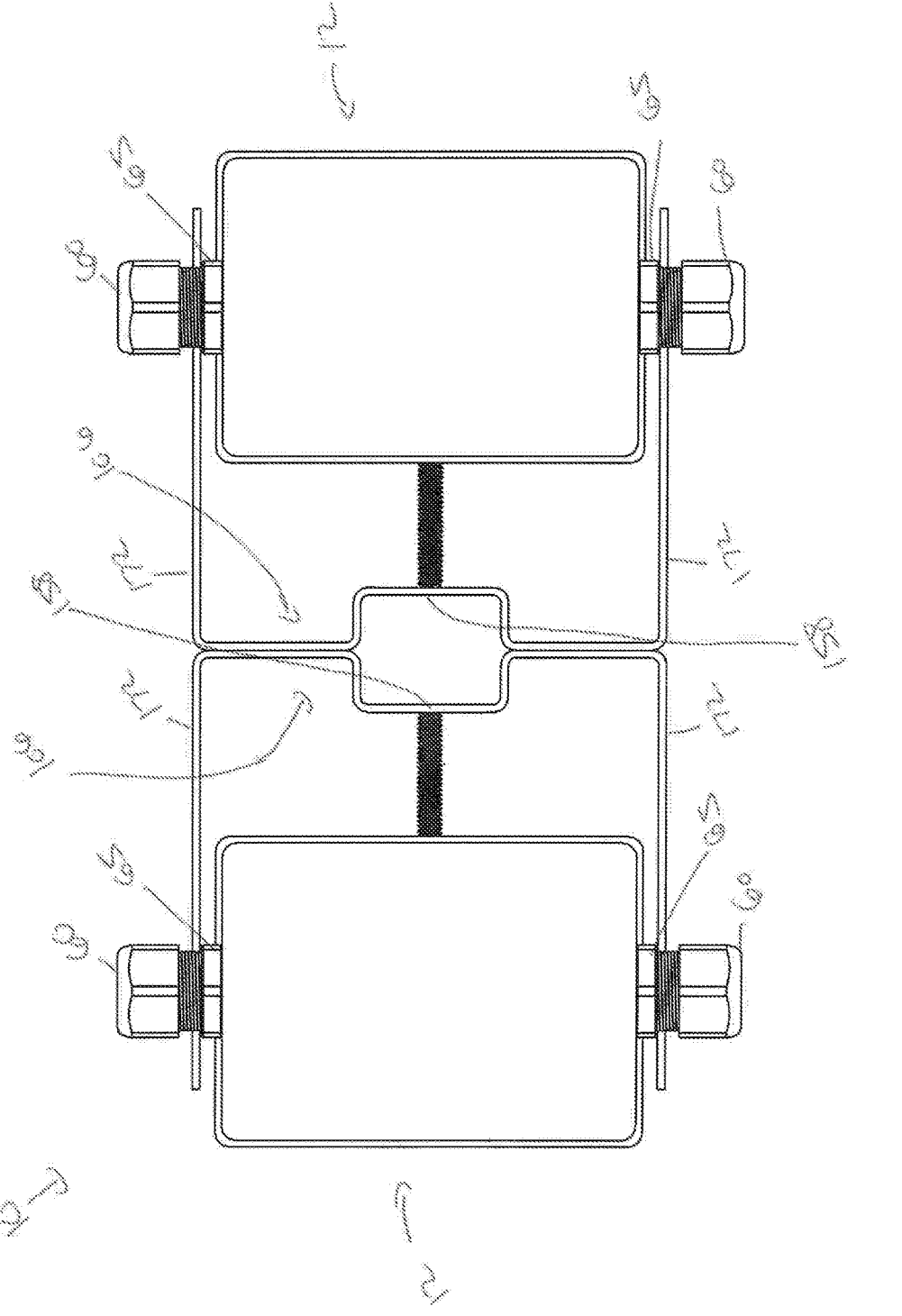
FIG. 10 shows a top view of a failure indication system, in accordance with one or more arrangements.
Figure 11:
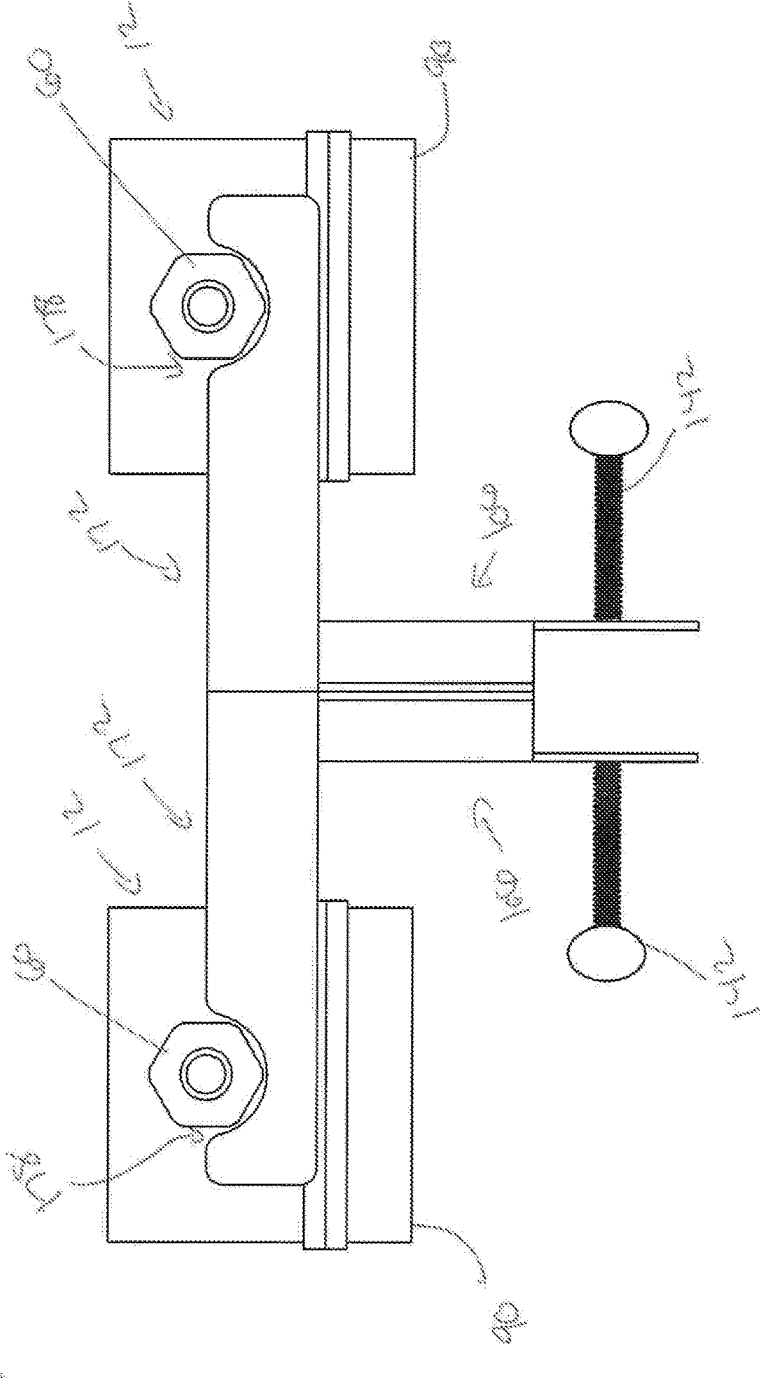
FIG. 11 shows a front view of a failure indication system, in accordance with one or more arrangements.
Figure 12:
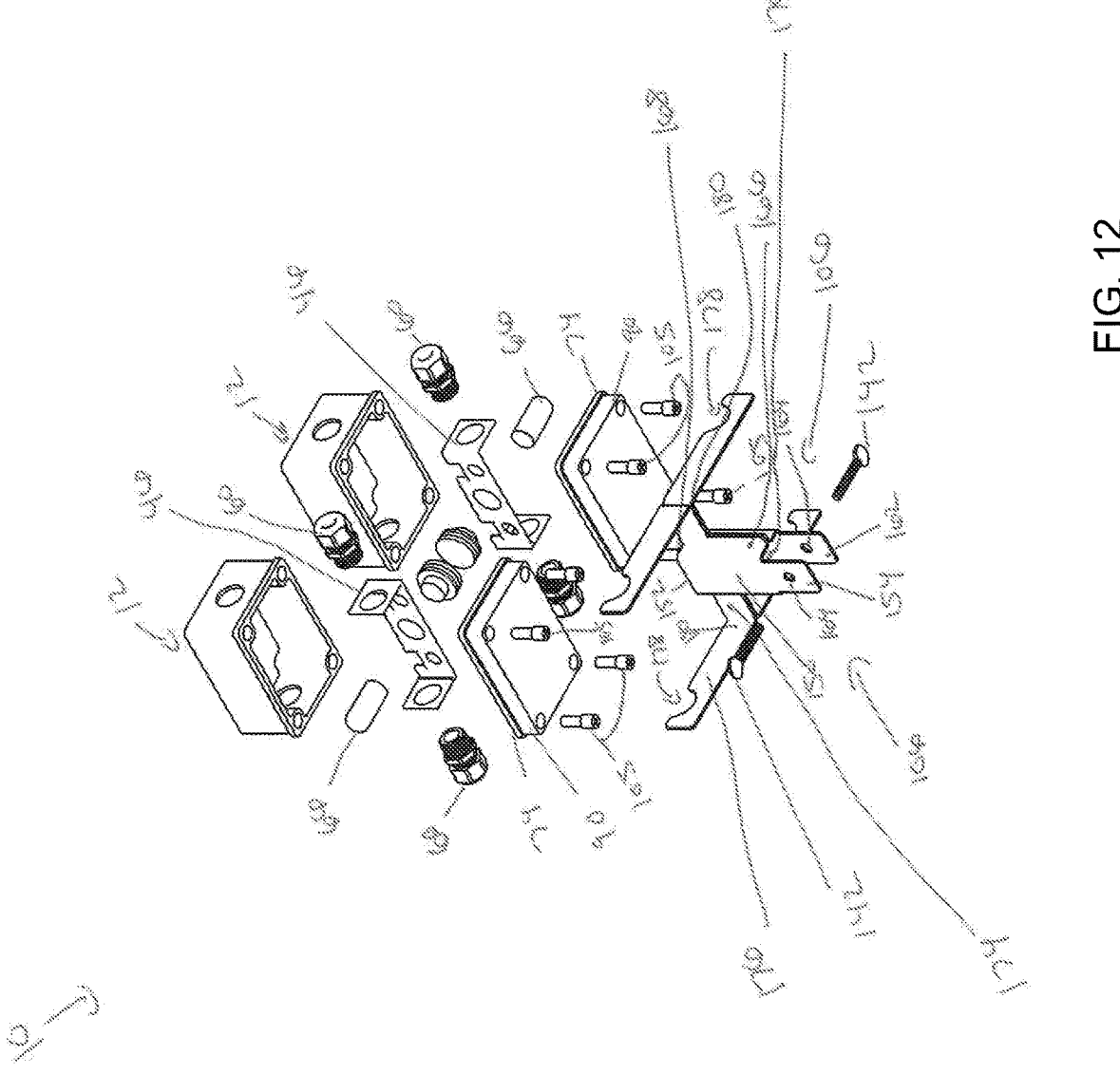
FIG. 12 shows an exploded lower front right perspective view of a failure indication system, in accordance with one or more arrangements.
Figure 13:
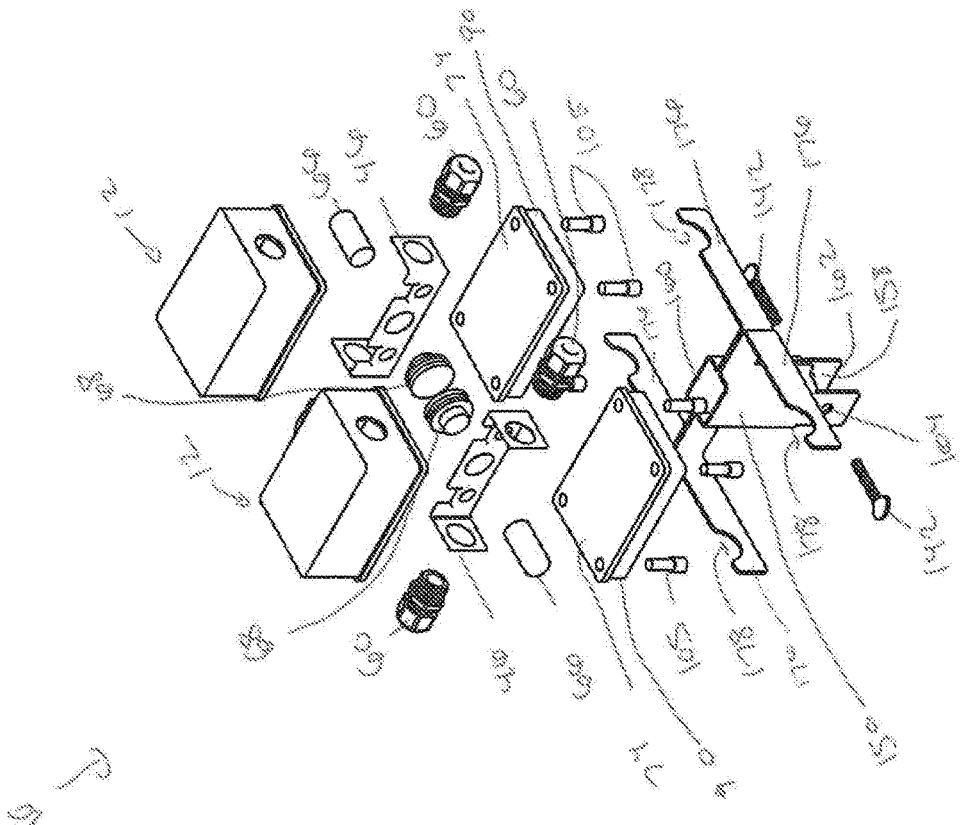
FIG. 13 shows an exploded upper front right perspective view of a failure indication system, in accordance with one or more arrangements.
Figure 14:
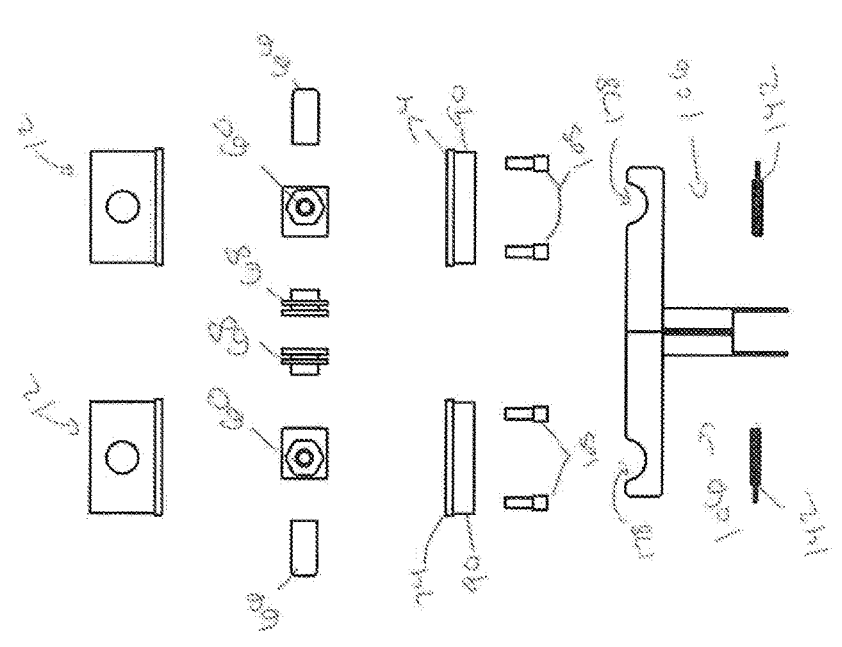
FIG. 14 shows an exploded front view of a failure indication system, in accordance with one or more arrangements.
Figure 14:
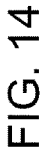
Figure 15:
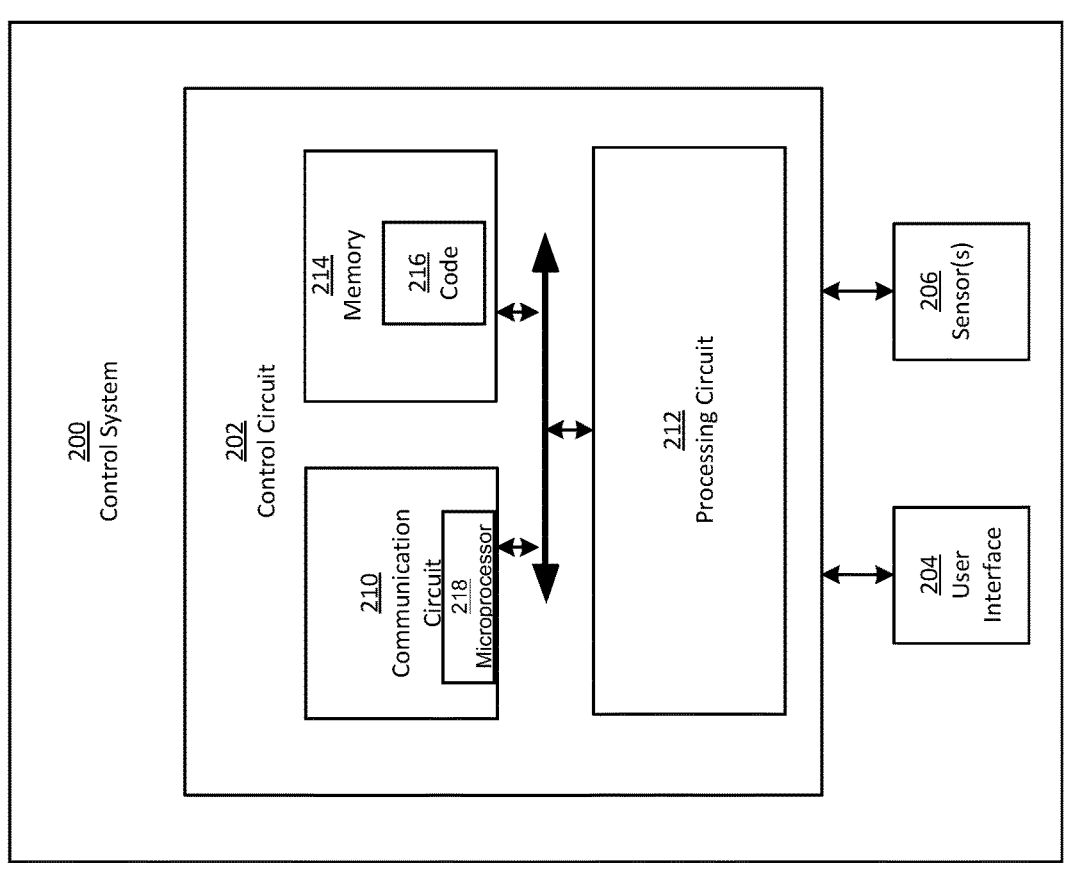
FIG. 15 shows a block diagram of an example control system for a failure indication system, in accordance with one or more arrangements.
Figure 16:
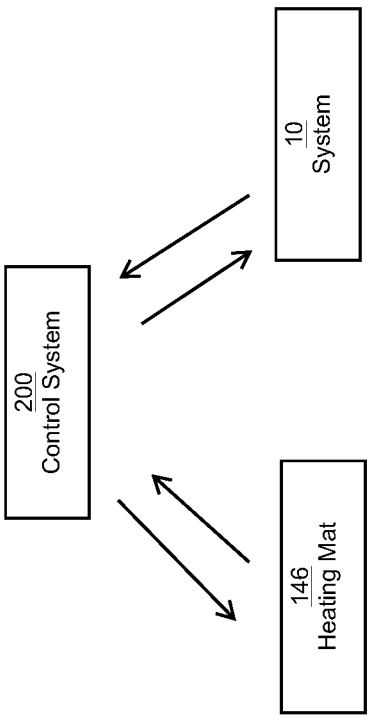
FIG. 16A shows a first example arrangement of a control system, a failure indication system, and a heating mat, in accordance with one or more arrangements.
FIG. 16B shows a second example arrangement of a control system, a failure indication system, and a heating mat, in accordance with one or more arrangements.
FIG. 16C shows a third example arrangement of a control system, a failure indication system, and a heating mat, in accordance with one or more arrangements.
Figure 16:
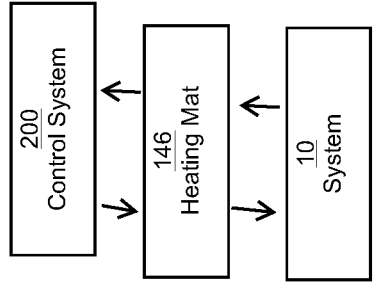
Figure 16:
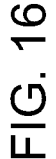
Figure 16:
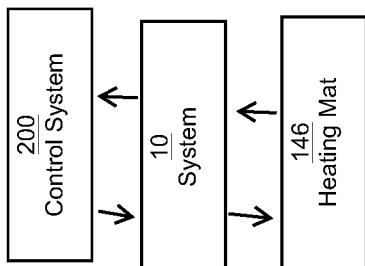
Figure 17:
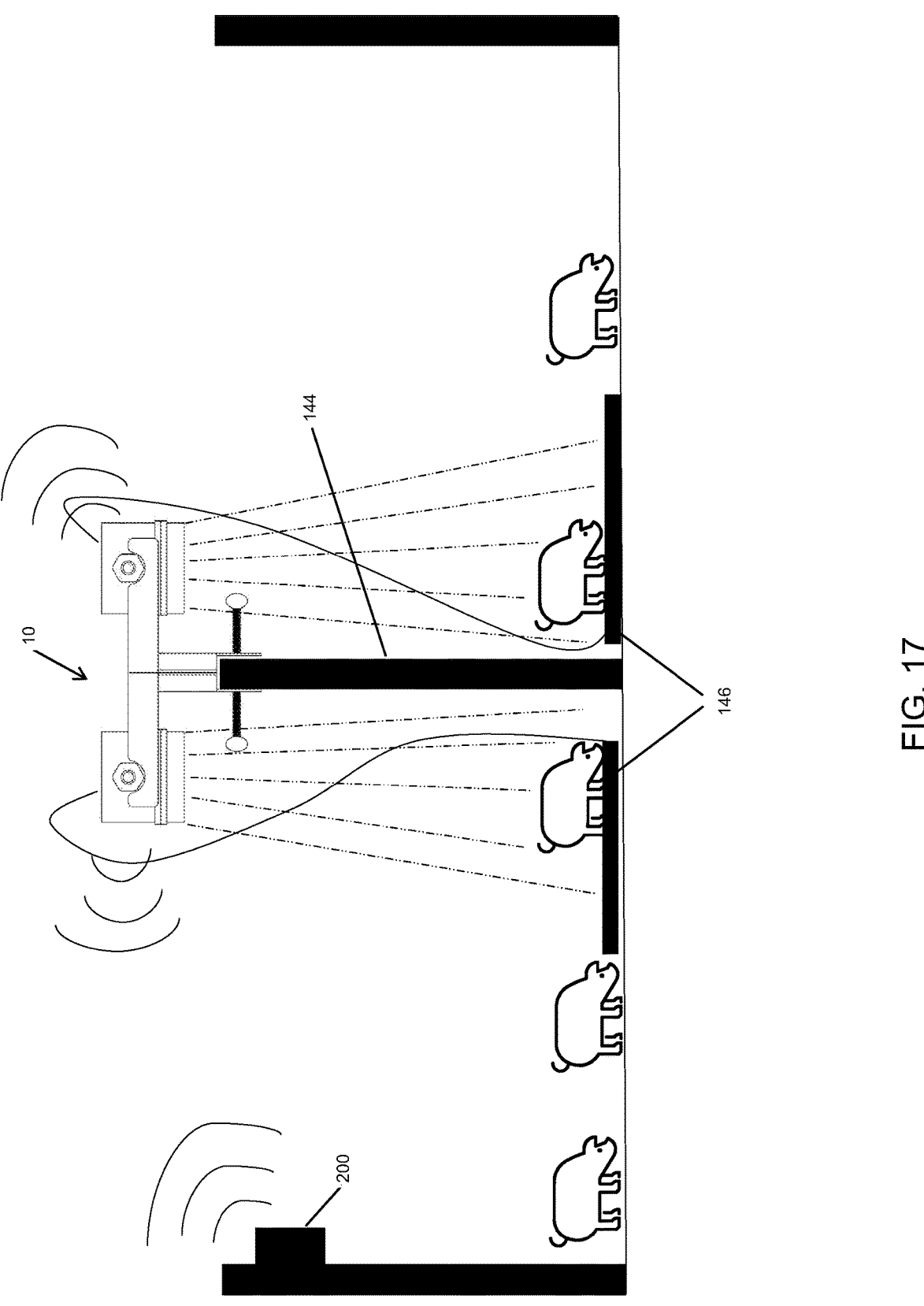
FIG. 17 shows an example control system, failure indication system, and heating mat, in accordance with one or more arrangements.

Alternative Arrangement:

With reference to FIGS. 9-14 and 17, an alternative arrangement of system 10 is presented. This alternative arrangement presented in FIGS. 9-14 and 17 is similar to the system 10 presented in FIGS. 1-8 and 15-16 and therefore, unless specifically stated otherwise herein, the prior teaching and disclosure shown in FIGS. 1-8 and 15-16 applies equally to the alternative arrangement shown in FIGS. 9-14 and 17. That is, the arrangement shown in FIGS. 9-14 and 17 is configured to be used with the same or similar system 10 with the primary difference relating to bracket 106 as is described herein.

Bracket 106:

In the arrangement shown in FIGS. 9-14 and 17, as one example, bracket 106 is formed of any suitable size, shape, and design and is configured to connect the various components of system 10 to a barrier 144 positioned in or around an area for animals. In the arrangement shown, as one example, bracket 106 includes a back wall 150, a front wall 158, one or more side walls 166, and one or more arms 172. However, any other suitable size, shape and design is hereby contemplated for use.

In this example arrangement, bracket 106 includes a back wall 150 having a generally planar rectangular shape which extends from a top edge 152 to a bottom edge 154 and extends between the one or more side walls 166. However, any other size, shape, design or configuration is hereby contemplated for use.

In this example arrangement, bracket 106 includes a front wall 158 having a generally planar rectangular shape which extends from a top edge 160 to a bottom edge 162 and extends between the one or more side walls 166. However, any other size, shape, design or configuration is hereby contemplated for use.

In this example arrangement, the back wall 150 and the front wall 158 of bracket 106 also include one or more openings 164. In this example arrangement, openings 164 are configured to allow one or more fasteners 142 to connect bracket 106 to barrier 144. In this example arrangement, fasteners 142 connect bracket 106 to barrier 144 using various methods or means including, but not limited to, for example, screws, bolts, clamps, pins, rivets, welding, snap connectors, friction fit connectors, stitching, hook and loop connectors, adhesives, chemical bonding, and/or any other process or means that results in a permanent of semi-permanent connection. However, any other size, shape, design or configuration is hereby contemplated for use.

In this example arrangement, bracket 106 also includes one or more side walls 166 having a generally planar rectangular shape which extends from a top edge 168 to a bottom edge 170 and extends between back wall 150/front wall 158 of bracket 106 and arm 172 of bracket 106. In this example arrangement, the bottom edge 154 of back wall 150 and the bottom edge 162 of front wall 158 extend farther than the bottom edge 170 of the one or more side walls 166. In this example arrangement, the one or more side walls 166 are positioned so that the bottom edge 170 of the one or more side walls 166 is located above the bottom edge 154 of back wall 150 and the bottom edge 162 of front wall 158. However, any other size, shape, design or configuration is hereby contemplated for use.

In this example arrangement, bracket 106 includes one or more arms 172 having a generally planar rectangular shape. In this example arrangement, the one or more arms 172 also include a first end 174 and a second end 176. In this example arrangement the first end 174 of the one or more arms 172 extends away from the bracket 106 and parallel to the back wall 150 of bracket 106. In this example arrangement, the second end 176 of the one or more arms 172 is connected to the first end 174 of the one or more arms 172 at a corner 180. In this example arrangement, the second end 176 extends away from bracket 106 and perpendicular to back wall 150 of bracket 106. In this example arrangement, second end 176 of the one or more arms 172 also includes a notch 178. However, any other size, shape, design or configuration is hereby contemplated for use.

In this example arrangement, one or more brackets 106 may be used in connection with system 10. For example, if an operator utilizes one or more lights 66 in connection with system 10, one or more brackets 106 are needed to connect system 10 with a barrier. However, only one barrier 144 may be available to hold system 10. In this example arrangement, one or more brackets 106 can be connected to a single barrier 144. In this example arrangement, in order to connect one or more brackets 106 to a single barrier 144, the barrier 144 is placed between the one or more brackets 106. In this example arrangement, the front wall 158 of each bracket 106 are positioned so that they are facing each other and so that the barrier 144 is between each front wall 158. In this example arrangement, openings 164 are configured to allow one or more fasteners 142 to connect bracket 106 to barrier 144. In this example arrangement, fasteners 142 connect bracket 106 to barrier 144 using various methods or means including, but not limited to, for example, screws, bolts, clamps, pins, rivets, welding, snap connectors, friction fit connectors, stitching, hook and loop connectors, adhesives, chemical bonding, and/or any other process or means that results in a permanent of semi-permanent connection. However, any other size, shape, design or configuration is hereby contemplated for use.

In this example arrangement, the components of bracket 106 are formed of any suitable size, shape, and design. In the arrangement shown, as one example, bracket 106 is comprised of metal materials. However, it is contemplated that the components of bracket 106 may be constructed of any type of material that can support the bracket's 106 connection to a barrier 144, but not limited, to wood, plastic, metals, and/or composite materials.

From the above discussion it will be appreciated that the failure indication system presented herein improves upon the state of the art. More specifically, and without limitation, it will be appreciated that in one or more arrangements a system is presented: that is safe to use; that is less susceptible to damage; that provides more uniform light distribution; that is configured for use in livestock operations; that is easy to deploy; that is easy to install; that has a long useful life; that is durable; that has a robust design; that is easy to use; and/or that is high quality. Example embodiments of the invention have been described in an illustrative manner. It is to be understood that the terminology that has been used is intended to be in the nature of words of description rather than of limitation. It will be appreciated by those skilled in the art that other various modifications could be made to the device without parting from the spirit and scope of this disclosure. All such modifications and changes fall within the scope of the claims and are intended to be covered thereby.

What is claimed:

1. A failure indication system, comprising:
   a light assembly;
   the light assembly having a housing;
   the light assembly having a bracket;
   the light assembly having a lighting element;
   a heating mat assembly;
   a control circuit;
   wherein the light assembly, the heating mat assembly, and the control circuit are electrically connected to one another;
   wherein the light assembly is configured to project a wavelength of light that is visible to animals that illuminates the heating mat assembly;
   wherein the control circuit is configured to detect when a fault has occurred with the heating mat assembly;
   wherein when the control circuit detects that a fault has occurred with the heating mat assembly, the control circuit causes the light assembly to indicate the heating mat assembly is not functioning properly.

2. The system of claim 1, wherein when the control circuit causes the light assembly to indicate the heating mat assembly is not functioning properly the control circuit causes the light assembly to pulse.

3. The system of claim 1, wherein when the control circuit causes the light assembly to indicate the heating mat assembly is not functioning properly the control circuit causes the light assembly to flash.

4. The system of claim 1, wherein when the control circuit causes the light assembly to indicate the heating mat assembly is not functioning properly, the control circuit causes the light assembly to turn off.

5. The system of claim 1, wherein the light assembly projects a warm amber glow.

6. The system of claim 1, wherein the light assembly projects a wavelength visually similar to that projected by a warming lamp.

7. The system of claim 1, wherein the bracket is connected to a barrier of an animal housing facility.

8. The system of claim 1, wherein the control circuit includes a microprocessor with memory and instructions.

9. The system of claim 1, wherein the control circuit includes a sensor that detects when a fault has occurred with the heating mat assembly.

10. The system of claim 1, wherein a fault means the heating mat assembly is not drawing power.

11. The system of claim 1, wherein a fault means the heating mat assembly is drawing too much power.

12. The system of claim 1, wherein a fault means the heating mat assembly is not drawing enough power.

13. The system of claim 1, wherein a fault means the heating mat assembly is drawing power outside of normal operating predetermined limits.

14. A failure indication system, comprising:

a light assembly;

the light assembly having a housing;

the light assembly having a bracket;

the light assembly having a lighting element;

a heating mat assembly;

a control circuit;

wherein the light assembly, the heating mat assembly and the control circuit are electrically connected to one another;

wherein the light assembly is configured to project a wavelength of light that is visible to animals that illuminates the heating mat assembly;

wherein the control circuit is configured to detect when a fault has occurred with the heating mat assembly;

wherein when the control circuit detects that a fault has occurred with the heating mat assembly, the control circuit causes the light assembly to indicate the heating mat assembly is not functioning properly;

wherein a fault means the heating mat assembly is drawing power outside of normal operating predetermined limits.

15. The system of claim 14, wherein when the control circuit causes the light assembly to indicate the heating mat assembly is not functioning properly the control circuit causes the light assembly to pulse.

16. The system of claim 14, wherein when the control circuit causes the light assembly to indicate the heating mat assembly is not functioning properly the control circuit causes the light assembly to flash.

17. The system of claim 14, wherein when the control circuit causes the light assembly to indicate the heating mat assembly is not functioning properly, the control circuit causes the light assembly to turn off.

18. The system of claim 14, wherein the light assembly projects a warm amber glow.

19. The system of claim 14, wherein the light assembly projects a wavelength visually similar to that projected by a warming lamp.

20. The system of claim 14, wherein the bracket is connected to a barrier of an animal housing facility.

21. The system of claim 14, wherein the control circuit includes a microprocessor with memory and instructions.

22. The system of claim 14, wherein the control circuit includes a sensor that detects when a fault has occurred with the heating mat assembly.

23. A failure indication system, comprising:

a housing;

a bracket;

a light;

wherein the light is communicatively connected to a heating mat;

a control system operably connected to the heating mat;

wherein the light is configured to attract an animal to the heating mat;

wherein the light is configured to produce a visual indicator;

wherein the control system is configured to operate in response to a damaged heating mat;

wherein the light is configured to provide the visual indicator in response to the control system.

24. The system of claim 23, wherein the visual indicator includes one or more of a pulsing light, a static light, a rotating light, or a colored light.

25. The system of claim 23, wherein the housing includes a hollow interior.

26. The system of claim 23, wherein the housing includes a hollow interior and wherein the light is positioned within the hollow interior of the housing.

27. The system of claim 23, further comprising a transparent lens.

28. The system of claim 23, further comprising a transparent lens which allows a user to observe the visual indicator.

29. The system of claim 23, wherein the bracket is comprised of one or more arms.

30. The system of claim 23, wherein the bracket is comprised of one or more arms having a notch.

31. The system of claim 23, wherein the bracket is comprised of one or more arms having a notch, and wherein the notch facilitates connection between the housing and the one or more arms.

32. The system of claim 23, wherein the bracket is configured to connect the light to a barrier.

* * * * *